(12) United States Patent
Karamavruc et al.

(10) Patent No.: US 11,818,831 B2
(45) Date of Patent: Nov. 14, 2023

(54) NOTCHED BAFFLED HEAT EXCHANGER FOR CIRCUIT BOARDS

(71) Applicant: BorgWarner Inc., Auburn Hills, MI (US)

(72) Inventors: Aliihsan Karamavruc, Fletcher, NC (US); Christopher Joel Maurus, Hendersonville, NC (US)

(73) Assignee: BorgWarner Inc., Auburn Hills, MI (US)

( * ) Notice: Subject to any disclaimer, the term of this patent is extended or adjusted under 35 U.S.C. 154(b) by 899 days.

(21) Appl. No.: 16/580,466

(22) Filed: Sep. 24, 2019

(65) Prior Publication Data

US 2021/0092827 A1 Mar. 25, 2021

(51) Int. Cl.
| | |
|---|---|
| *H05K 1/00* | (2006.01) |
| *H05K 1/02* | (2006.01) |
| *H05K 7/20* | (2006.01) |
| *F02B 39/10* | (2006.01) |
| *F02B 39/00* | (2006.01) |
| *F02B 37/04* | (2006.01) |

(52) U.S. Cl.
CPC ........... *H05K 1/0203* (2013.01); *F02B 37/04* (2013.01); *F02B 39/005* (2013.01); *F02B 39/10* (2013.01); *H05K 7/20272* (2013.01); *H05K 2201/064* (2013.01)

(58) Field of Classification Search
CPC ............. H05K 1/0203; H05K 7/20272; H05K 7/20263; H05K 7/20436; H05K 7/20872; H05K 7/20927; H05K 7/20772; H05K 7/20254; H05K 2201/064; F02B 37/04; F02B 39/005; F02B 39/10; F28F 13/06; F28F 13/12; F28F 2215/04; F28F 2009/226; F28F 2009/222; F28D 9/0068; F28D 9/22; F28D 1/0383
See application file for complete search history.

(56) References Cited

U.S. PATENT DOCUMENTS

| | | | |
|---|---|---|---|
| 2,395,543 A * | 2/1946 | Gallaher | ................. F24D 1/005 165/145 |
| 3,361,195 A | 1/1968 | Meyerhoff et al. | |
| 4,278,126 A * | 7/1981 | Skrzypek | ............ F28D 21/0008 165/122 |
| 4,801,778 A * | 1/1989 | Mizutani | ................. H05B 6/60 219/774 |
| 4,903,640 A * | 2/1990 | Howard | .................... F27D 1/12 266/190 |
| 6,301,109 B1 | 10/2001 | Chu et al. | |

(Continued)

*Primary Examiner* — Travis Ruby
(74) *Attorney, Agent, or Firm* — von Briesen & Roper, s.c.

(57) ABSTRACT

A heat exchanger for cooling high temperature components of a circuit board is disclosed. The heat exchanger may comprise a housing including a coolant inlet, a coolant outlet, a first side wall, a second side wall, and an upper housing portion assembled with a lower housing portion. The heat exchanger may further include a first array of plates on the upper housing portion, and a second array of plates on the lower housing portion extending parallel to and interleaved with the first array of plates. Each of the plates may have an aperture that is laterally and vertically opposed to the aperture of an immediately adjacent plate. The interleaving first and second arrays of plates may create a lateral and vertical serpentine fluid flow path.

18 Claims, 6 Drawing Sheets

(56) References Cited

U.S. PATENT DOCUMENTS

| | | | |
|---|---|---|---|
| 6,729,383 B1 | 5/2004 | Cannell et al. | |
| 6,988,535 B2 | 1/2006 | Upadhya et al. | |
| 7,762,316 B2* | 7/2010 | Lin | H05K 7/20518 165/80.4 |
| 8,110,746 B2 | 2/2012 | Lu et al. | |
| 8,411,438 B2 | 4/2013 | Kubo et al. | |
| 9,291,405 B2 | 3/2016 | Pentapati et al. | |
| 9,622,380 B1 | 4/2017 | Joshi et al. | |
| 2001/0045276 A1* | 11/2001 | Ohashi | F28D 1/0383 257/E23.098 |
| 2009/0145581 A1 | 6/2009 | Hoffman et al. | |
| 2010/0290190 A1 | 11/2010 | Chester et al. | |
| 2015/0116938 A1* | 4/2015 | Nakanishi | B23P 15/26 165/104.11 |
| 2016/0120063 A1* | 4/2016 | Cheng | H01L 23/473 165/104.31 |
| 2021/0278144 A1* | 9/2021 | Blokhin | F28D 7/16 |

\* cited by examiner

NOTCHED BAFFLED HEAT EXCHANGER FOR CIRCUIT BOARDS

TECHNICAL FIELD

The present disclosure generally relates to cooling structures and, more specifically, to heat exchangers used for cooling circuit boards.

BACKGROUND

Printed circuit boards (PCBs) are used to mechanically support and electrically connect electronic components in various applications. PCBs are made from an insulating material with one or more metal-coated surfaces. The metal-coated surfaces are etched to create pathways for electricity to travel among various components which are surface mounted on the board. PCBs are found in numerous devices such as electronic appliances, cell phones, televisions, computers, printers, as well as automotive systems. For example, PCBs may be used in passenger or commercial vehicles having an electric turbocharger. Electric turbochargers include an electrically-driven compressor combined with a conventional, exhaust-driven turbocharger. The electrically-driven compressor serves to improve boost pressure at low engine speeds and reduce turbocharger lag.

Certain components on PCBs may reach high temperatures during use. These components, known as "high temperature components," specifically require active cooling solutions in direct contact with the component to dissipate heat in order for the PCB to operate without interruption or failure. High temperature components that fall under this unique class of PCB components may include voltage regulators, processing units, power transistors, and memory modules, among others. A heat exchanging cooling system may be mounted to the PCB to extract heat from the high-temperature components. Conventional fluid-based cooling systems may have a cooling block structure that is mounted to the PCB. Within the cooling block may be an array of round pins through which a coolant flows to extract heat from the PCB. However, even when in a staggered configuration, the geometry of the array of cooling pins may dampen fluid turbulence and produce a highly laminar flow in the coolant. The laminar flow of the coolant may be inefficient in extracting heat.

U.S. Pat. No. 3,361,195 discloses a heat sink member for semiconductor devices that includes an array of passageways arranged in a serpentine path to provide good turbulence in a liquid coolant flowing therethrough. While effective, there remains a need for improved heat exchanger designs for efficiently extracting heat from high-temperature components of PCBs.

SUMMARY

In accordance with one aspect of the present disclosure, a heat exchanger for cooling a circuit board is disclosed. The heat exchanger may comprise a housing including a coolant inlet, a coolant outlet, a first side wall, and a second side wall. The housing may have an upper housing portion assembled with a lower housing portion. The heat exchanger may further include a first array of plates on the upper housing portion. Each of the plates of the first array may extend laterally between the first side wall and the second side wall and may have a solid construction with an aperture at a bottom corner of the plate nearest the first side wall. In addition, the heat exchanger may further include a second array of plates on the lower housing portion extending parallel to and interleaved with the first array of plates. Each of the plates of the second array may extend laterally between the first side wall and the second side wall of the housing and may have a solid construction with an aperture at an upper corner of the plate nearest the second side wall.

In accordance with another aspect of the present disclosure, a heat exchanger for cooling high temperature components of a circuit board is disclosed. The heat exchanger may comprise a housing that includes a coolant inlet, a coolant outlet, a first side wall, a second side wall, and an upper housing portion assembled with a lower housing portion. The heat exchanger may further comprise a first array of plates on the upper housing portion, and a second array of plates on the lower housing portion extending parallel to and interleaved with the first array of plates. Each of the plates of the first and second arrays may have an aperture that is laterally and vertically opposed to the aperture of an immediately adjacent plate.

In accordance with another aspect of the present disclosure, a method for cooling a circuit board on a machine is disclosed. The method may comprise assembling a heat exchanger with the circuit board. The heat exchanger may comprise a housing having a coolant inlet, a coolant outlet, a first side wall, a second side wall, and an upper housing portion assembled with a lower housing portion. The heat exchanger may further comprise a first array of plates on the upper housing portion, and a second array of plates on the lower housing portion interleaved with the first array of plates. Each of the plates of the first array may extend laterally between the first side wall and the second side wall of the housing and may have an aperture at a bottom corner of the plate nearest the first side wall. Each of the plates of the second array may extend laterally between the first side wall and the second side wall of the housing and may have an aperture at an upper corner of the plate nearest the second side wall. The method may further comprise receiving coolant from the machine through the coolant inlet, and flowing the coolant through the interleaved plates of the first and second arrays. The coolant may follow a lateral and vertical serpentine fluid flow path through the interleaved plates. The method may further comprise extracting heat from the high temperature components of the circuit board into the coolant as the coolant flows through the lateral and vertical serpentine fluid flow path, and discharging the coolant through the coolant outlet.

These and other aspects and features of the present disclosure will be more readily understood when read in conjunction with the accompanying drawings.

DETAILED DESCRIPTION

Figure 1:
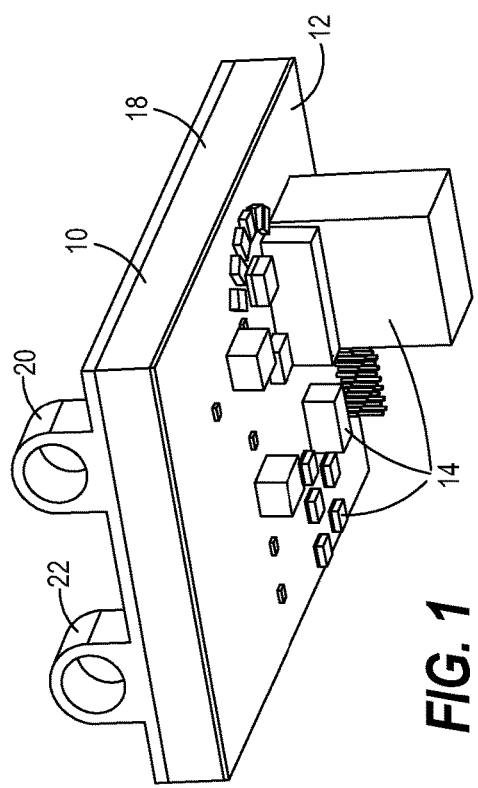
FIG. 1 is a perspective view of a heat exchanger assembled with a printed circuit board, constructed in accordance with the present disclosure.
Figure 2:
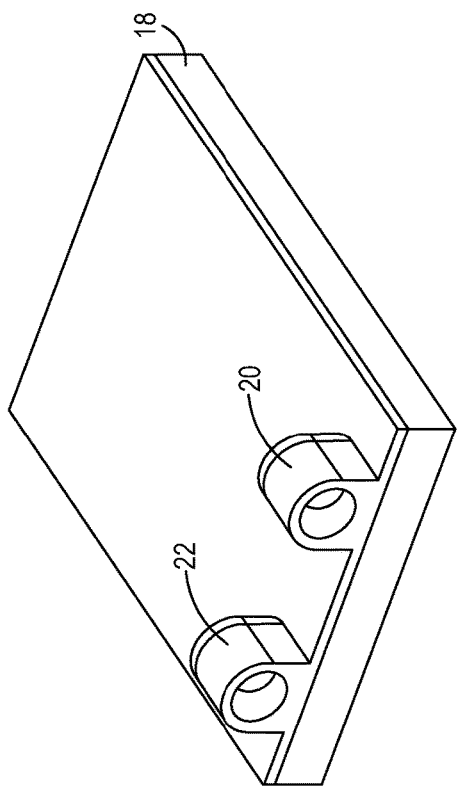
FIG. 2 is a perspective view of the heat exchanger shown in isolation, constructed in accordance with the present disclosure.
Figure 5:
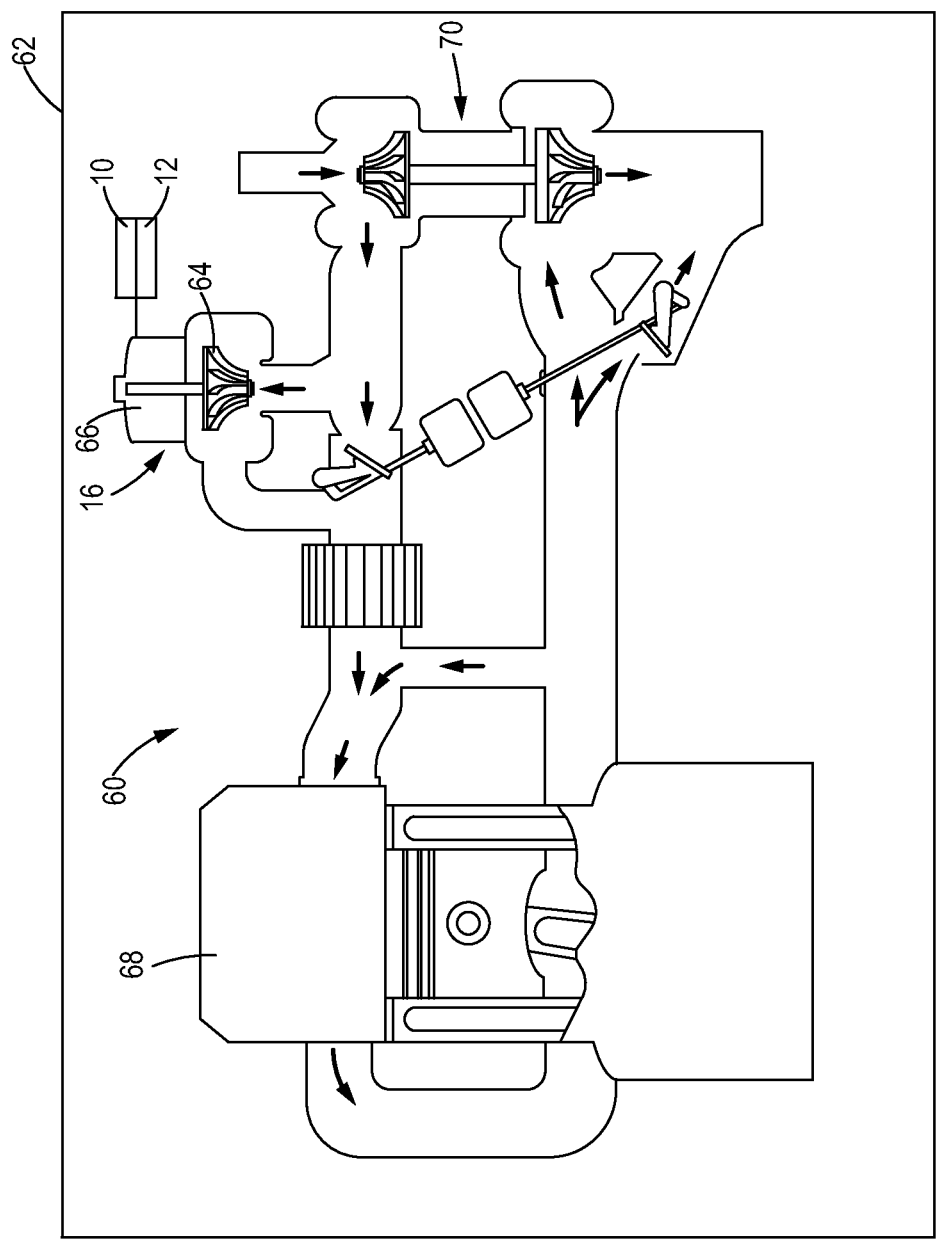
FIG. 5 is a schematic representation of an electric turbocharger in which the heat exchanger and the circuit board may be implemented, constructed in accordance with the present disclosure.

Referring now to the drawings and with specific reference to FIGS. 1-2, a heat exchanger 10 assembled with a printed circuit board 12 is shown. The circuit board 12 may be associated with any machine that uses a coolant, such as an automobile. The circuit board 12 may have various surface mounted components 14, some of which may reach high temperatures during operation. High temperature components that fall under this unique class of surface mounted components 14 of the circuit board 12 may include voltage regulators, processing units, power transistors, and memory modules, among others. As one example explained further below, the circuit board 12 may be used to operate an electric turbocharger 16 of an automobile (see FIG. 5). The heat exchanger 10 may be assembled on top of the circuit board 12 for cooling high temperature components on the circuit board 12. The heat exchanger 10 may include a housing 18 having a coolant inlet 20 for receiving a coolant, and a coolant outlet 22 for discharging the coolant. The coolant may include water with or without an additive, and with or without an alcohol (methanol, ethanol, glycols, etc.). As explained further below, the heat exchanger 10 may create turbulent flow in the coolant for more efficient heat extraction and cooling of the high temperature components of the circuit board 12.

Figure 3:
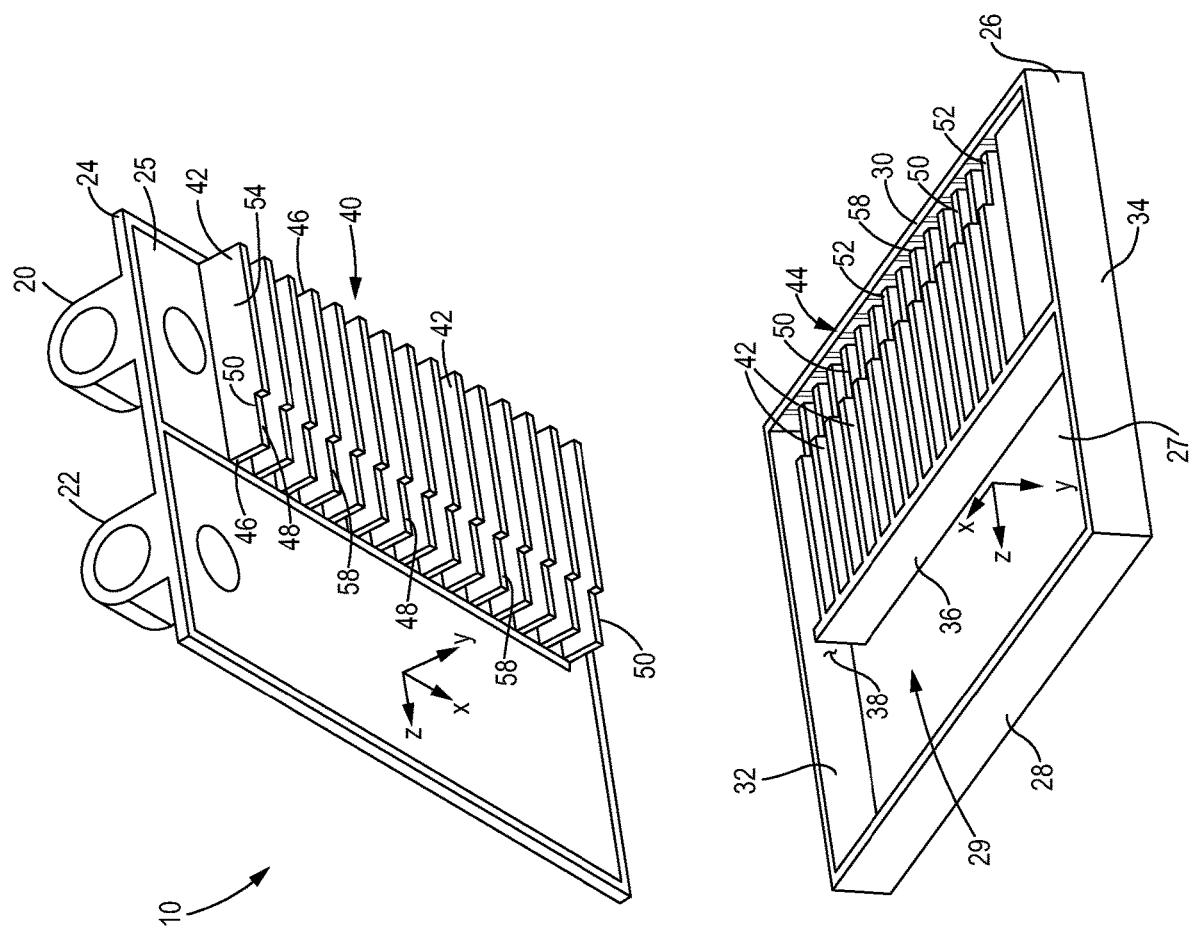
FIG. 3 is a perspective view of the heat exchanger with upper and lower housing portions of the heat exchangers separated, constructed in accordance with the present disclosure.

Turning to FIG. 3, the housing 18 of the heat exchanger 10 may include a first housing portion 24, and a second housing portion 26 separate from the first housing portion 24. The first housing portion 24 and the second housing portion 26 may be assembled and sealed together when the heat exchanger 10 is in use. Alternatively, the heat exchanger 10 may be formed through a casting process, such as sand casting, in which a mold core is used to form interior features of the heat exchanger 10. In addition, the housing 18 may include a first side wall 28, a second side wall 30 opposed to the first side wall 28, a first end wall 34, and a second end wall 32 opposed to the first end wall 34. The housing 18 may also define a third side wall 25 and a fourth side wall 25 opposed to the third side wall 25. The housing 18 defines a volume 29 bounded by the first end wall 34, the second end wall 32, the third side wall 25, the fourth side wall 27, the first end wall 34, and the second end wall 32. The housing 18 may also include an intermediate wall 36 located between the first side wall 28 and the second side wall 30 and extending between the third side wall 25 and the fourth side wall 27. In embodiments in which the housing 18 is formed from a first housing portion 24 and a second housing portion 26, the intermediate wall 36 can extend from one of the third side wall 25 and the fourth side wall 27 toward the remaining one of the third side wall 25 and the fourth side wall 27. In embodiments in which the housing is unitary (e.g., via a sand casting process), the intermediate wall 36 can extend between and be connected to the third side wall 25 and the fourth side wall 27. The intermediate wall 36 may extend from the first end wall 34 towards the second end wall 32 with a gap 38 between the intermediate wall 36 and the second end wall 32. The intermediate wall 36 may or may not be equidistant from the first side wall 28 and the second side wall 30. The coolant inlet 20 and the coolant outlet 22 may both be located on the first housing portion 24, as shown, or at other locations of the housing 18.

In the illustrated embodiment of FIG. 3, the first housing portion 24 includes a first array 40 of plates 42 that extend laterally (along the z-axis) between the first side wall 28 and the second side wall 30 of the housing 18. Similarly, second housing portion 26 includes a second array 44 of plates 42 that extend laterally (along the z-axis) between the first side wall 28 and the second side wall 30. When the first housing portion 24 and the second housing portion 26 are assembled together, the first array 40 of plates 42 interleave with and extend parallel to the second array 44 of plates 42. In the embodiment shown in FIG. 3, the interleaving plates 42 are bound on one side by the intermediate wall 36 and on the other side by the second side wall 30. In embodiments that do not include the intermediate wall 36, the interleaving plates 42 are bound on one side by the first side wall 28 and on the other side by the second side wall 30. The plates 42 of the second array 44 may be integral with or may form a tight fit with the intermediate wall 36 (or the first side wall 28 in embodiments that do not include the intermediate wall 36) and the second side wall 30 to prevent coolant from flowing therebetween. In addition, side surfaces 46 of the first array 40 of plates 42 may form a tight fit with the intermediate wall 36 (or the first side wall 28 in embodiments that do not include the intermediate wall 36) and the second side wall 30 to prevent coolant from flowing therebetween when the upper housing portion 24 is assembled with the lower housing portion 26 (also see FIG. 4).

Referring to the embodiment illustrated in FIG. 3, a corner 48 of each of the plates 42 of the first array 40 nearest the intermediate wall 36 (or nearest the first side wall 28 in embodiments that do not include the intermediate wall 36) includes an aperture 50. In addition, a corner 52 of each of the plates 42 of the second array 44 nearest the second side wall 30 includes an aperture 50. The apertures 50 are illustrated with a rectangular shape. In various embodiments, the apertures 50 have other shapes, such as squares, semi-circles, semi-ovals, or triangles.

Figure 4:
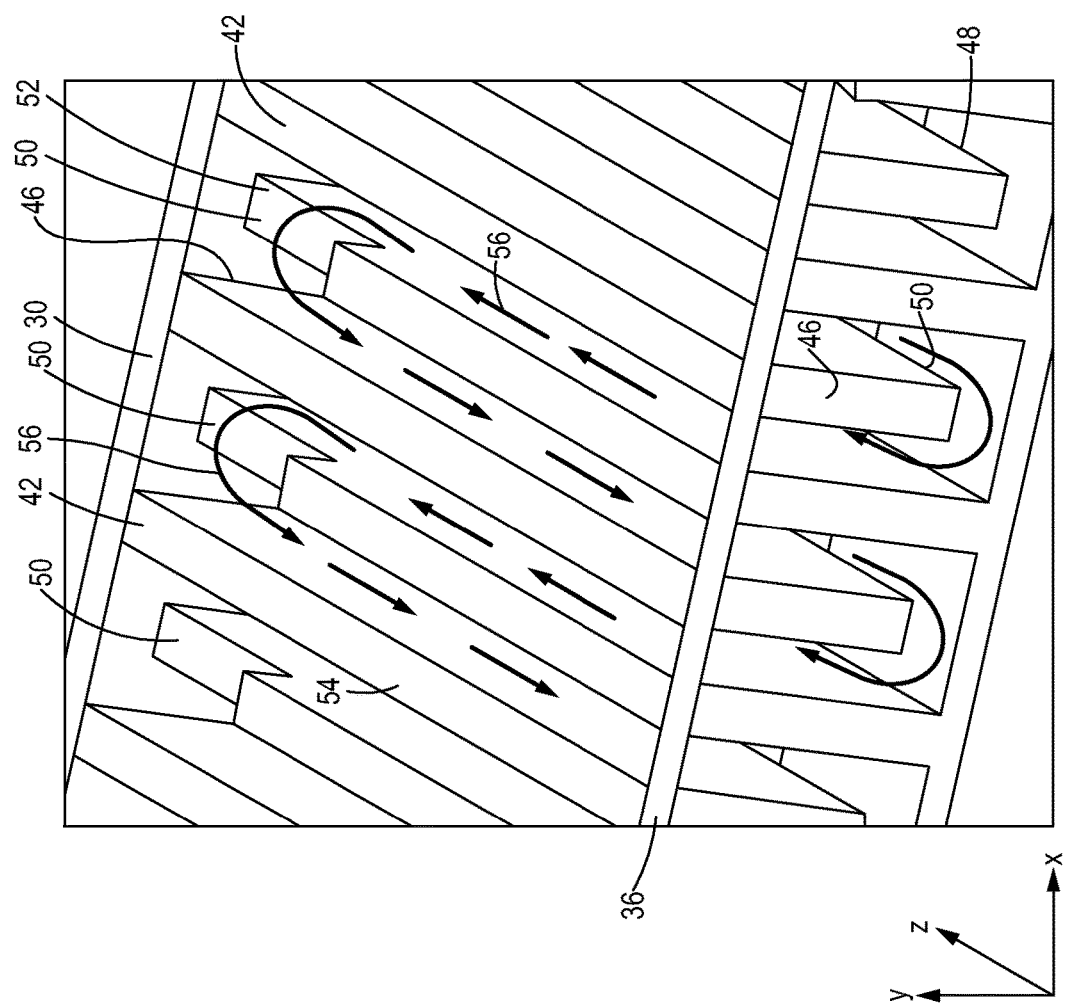
FIG. 4 is a perspective view illustrating a lateral and vertical serpentine fluid flow path of coolant through the heat exchanger, constructed in accordance with the present disclosure.

When the plates 42 of the first and second arrays 40 and 44 are interleaved as shown in FIG. 4, the aperture 50 of each of the plates 42 may be offset along the illustrated "z" and "y" axes relative to apertures 50 of immediately adjacent plates 42. In the illustrated embodiment, aside from the apertures 50, the plates 42 of the first and second arrays 40 and 44 are solid (e.g., without holes or breaks that penetrate through the walls 54 of the plates 42). Accordingly, the interleaving first and second arrays 40 and 44 of the plates 42 forces the coolant to flow through a a zig-zag (e.g., along the "z" and "y" axes) serpentine fluid flow path 56. Such a serpentine flow path create turbulent flow in the coolant. Applicant has found that the turbulent coolant flow provided by the heat exchanger 10 of the present disclosure provides superior heat extraction from the circuit board 12 compared to the conventional round pin array geometry (which provides more laminar coolant flow).

The zig-zag, serpentine fluid flow path 56 is depicted in FIG. 4. The coolant may flow between the plates 42 along the z-axis in alternating directions, as well as along the y-axis in alternating directions as the coolant flows through the apertures 50 of the first array 40 and second array 44 of interleaving plates 42 to travel from the coolant inlet 20 to the coolant outlet 22. Referring again to FIG. 3, for embodiments that include the intermediate wall 36, after flowing through the interleaving plates 42, the coolant flows around the intermediate wall 36 through the gap 38 and out of the heat exchanger 10 through the coolant outlet 22.

In the exemplary design shown in FIGS. 3 and 4, the first and second arrays 40 and 44 of plates 42 extend from the intermediate wall 36 to the second side wall 30. In alternative designs, the intermediate wall 36 may have another location than that shown. In other configurations, the interleaving first and second arrays 40 and 44 of plates 42 may be localized just on top of the high temperature components of the circuit board 12. In other words, the heat exchanger 10 may have one or more smaller sections of interleaving plates 42 just above the high temperature components of the circuit board 12. Applicant has found that concentrating the interleaving plates 42 at the high temperature components provides efficient heat extraction as well.

The plates 42 of the first and second arrays 40 and 44 may be linear (non-curved) and may have a rectangular shape, as shown in FIGS. 3-4. However, in other configurations, the plates 42 may have other shapes or may be curved. Additionally, the apertures 50 of the first array 40 of plates 42 may be indentations 58 at the bottom corners 48 of the plates 42, and the apertures 50 of the second array 44 of plates 42 may be indentations 58 at the upper corners 52 of the plates 42 (see FIG. 3). The indentations 58 may be cutouts at the bottom and upper corners 48 and 52 of the plates 42 of the first and second arrays 40 and 44, respectively. The indentations 58 may be rectangular or have other shapes, such as square shaped, semi-circle shaped, semi-oval shaped, or triangle shaped. In other alternative configurations, the apertures 50 may be holes that penetrate through the walls 54 of the plates at or proximate to the corners 48 and 52 of the plates 42 of the first and second arrays 40 and 44, respectively.

As turbulent flow may increase fluid resistant, the number of plates 42 of the first and second arrays 40 and 44 may be adjusted to control the resistance of the coolant flowing through the heat exchanger 10. More specifically, the number of plates 42 of the first and second arrays 40 and 44 may be reduced to lower resistance such that the coolant can be pushed or driven through the heat exchanger 10 at lower pressures. Alternatively or in addition to this, concentrating smaller sections of interleaving plates 42 just above the high temperature components of the circuit board 12 may also serve to lower resistance, allowing the coolant to be pushed through the heat exchanger 10 at lower pressures.

Figure 7:
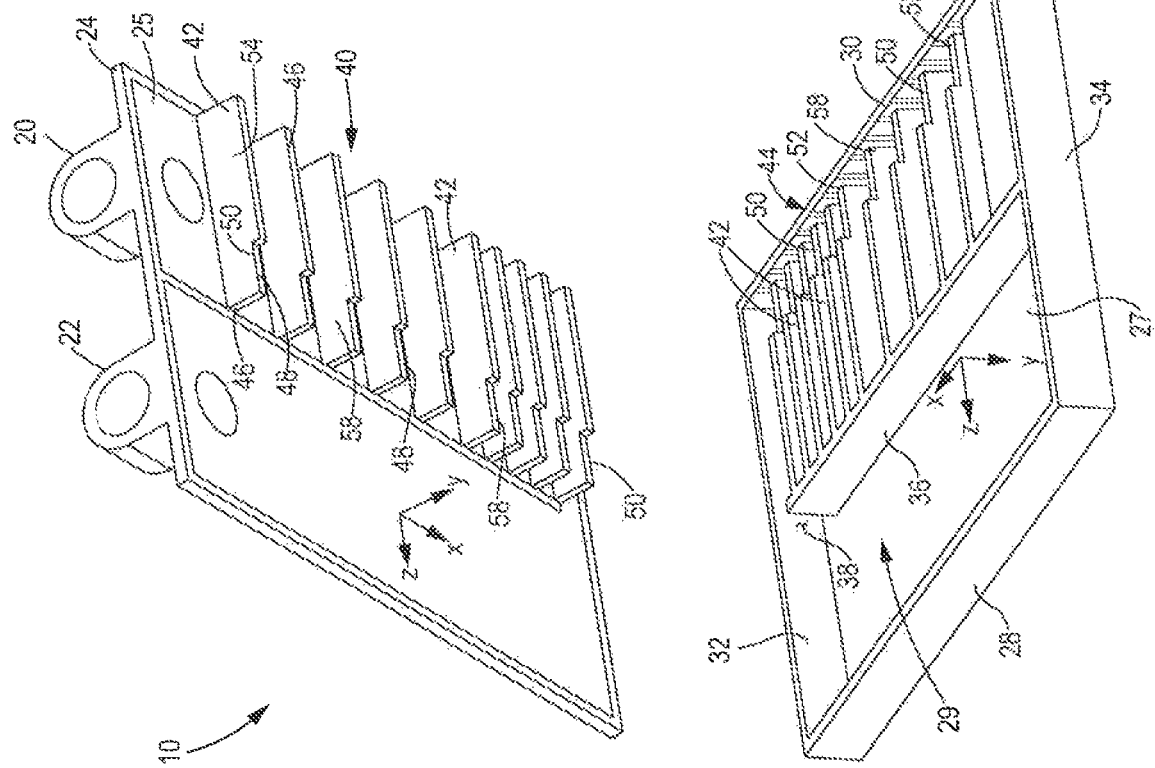
FIG. 7 is a perspective view of an alternate embodiment of the heat exchanger with upper and lower housing portions of the heat exchangers separated, constructed in accordance with the present disclosure.

Stated differently, the spacing between adjacent interleaving plates 42 may be selectively reduced at locations proximate to high temperature components and may be selectively increased at locations away from high temperature components to increase cooling capability for the high temperature components while keeping coolant flow resistance as low as possible (see FIG. 7).

As a non-limiting example, the heat exchanger 10 may be used to cool a circuit board 12 of an electric turbocharger 16 used in an engine system 60 of a machine 62, such as an automobile. The electric turbocharger 16 may include a supplemental compressor 64 driven by an electric motor 66 that provides supplemental boost pressure to an engine 68 of the machine 62 at low engine speeds to reduce or eliminate turbo lag. At higher engine speeds and when engine exhaust volumes are greater, a conventional exhaust-driven turbocharger 70 may take over and supply compressed air to the engine. However, it will be understood that the circuit board heat exchanger 10 disclosed herein may be used to cool any type of circuit board used in any type of machine that includes a source of coolant.

INDUSTRIAL APPLICABILITY

In general, the teachings of the present disclosure may find applicability in many industries including, but not limited to, automotive industries. More specifically, the teachings of the present disclosure may be applicable to any type of machine having circuit boards with components that reach high temperatures during use.

Figure 6:
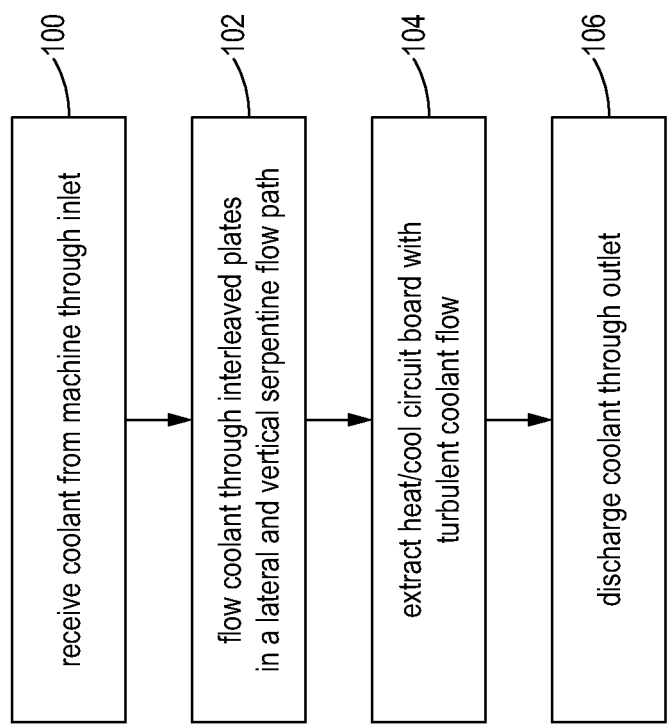
FIG. 6 is a flowchart illustrating a series of steps that may be involved in cooling the circuit board using the heat exchanger, in accordance with a method of the present disclosure.

FIG. 6 is a flowchart showing a series of steps that are involved in cooling the circuit board 12 using the heat exchanger 10 according to one embodiment. At a first block 100, the heat exchanger 10 receives coolant from a coolant source of the associated machine through the coolant inlet 20. At a next block 102, the received coolant flows through the interleaved plates 42 of the first and second arrays 40 and 44 in the zig-zag, serpentine fluid flow path 56 (see FIG. 4). Specifically, as explained above, the coolant may flow in the z-axis direction (illustrated in FIGS. 3 and 4) between the plates 42 in alternating directions, and in the y-axis direction (illustrated in FIGS. 3 and 4) in alternating directions as the coolant flows through the apertures 50 on opposing sides of the plates 42 (see FIG. 4). This flow creates turbulence in the coolant flow, which efficiently extracts heat from the high temperature components of the circuit board 12 (block 104). At a next block 106, the coolant is discharged through the coolant outlet 22.

The present disclosure provides a heat exchanger for cooling circuit boards using turbulent coolant flow. The heat exchanger includes interleaving arrays of plates that direct the coolant flow in both a lateral and vertical serpentine flow path to generate turbulence in the coolant. Each of the plates have an aperture that is laterally and vertically opposed to an aperture of an immediately adjacent plate. As such, the coolant is forced both laterally between the plates and vertically through the apertures in alternating directions as the coolant flows through the interleaving plates. The turbulent coolant flow in the heat exchanger of the present disclosure provides more efficient heat extraction than conventional circuit board heat exchangers that produce more laminar coolant flow and dampen fluid turbulence.

What is claimed is:

1. A heat exchanger for cooling a circuit board, comprising:
   a housing defining a volume bounded by:
      a first side wall and a second side wall opposed to the first side wall; a third side wall and a fourth side wall opposed to the third side wall; and
      a first end wall and a second end wall opposed to the first end wall, wherein the housing includes a coolant inlet in communication with the volume and a coolant outlet in communication with the volume, the housing having a first housing portion separable with a second housing portion;
   a first array of plates disposed on the third side wall, each of the plates of the first array extending toward but not attached to the fourth side wall and extending laterally between the first side wall and the second side wall of the housing and having a solid construction with an aperture at a corner of the plate nearest the first side wall and fourth wall; and
   a second array of plates disposed on the fourth side wall, each of the plates of the second array extending parallel to and interleaved with the first array of plates, each of the plates of the second array extending toward but not attached to the third side wall and extending laterally between the first side wall and the second side wall of the housing and having a solid construction with an aperture at a corner of the plate nearest the second side wall and the third wall.

2. The heat exchanger of claim 1, wherein the apertures in the interleaving first and second arrays of plates define a coolant flow path, wherein the coolant inlet is in communication with a first portion of the volume at a first end of the coolant flow path, and wherein the coolant outlet is in fluid communication with a second portion of the volume at the second end of the coolant flow path.

3. The heat exchanger of claim 2, wherein the apertures of the first array of plates are indentations at the bottom corner of each plate, and wherein the apertures of the second array of plates are indentations at the upper corner of each plate.

4. The heat exchanger of claim 3, wherein the indentations of the first array of plates are cutouts at the bottom corner of each plate, and wherein the indentations of the second array of plates are cutouts at the upper corner of each plate.

5. The heat exchanger of claim 3, wherein the plates of the first and second array are rectangular.

6. The heat exchanger of claim 2, wherein the heat exchanger is configured to assemble on top of the circuit board.

7. The heat exchanger of claim 6, wherein the interleaving first and second arrays of plates are localized on top of high temperature components of the circuit board.

8. The heat exchanger of claim 6, wherein a number of the plates of the first and second arrays is adjusted to control a resistance of the coolant flowing through the heat exchanger.

9. The heat exchanger of claim 6, wherein spacing between the arrays of plates is selectively reduced at locations proximate a high temperature components and selectively increased at locations away from high temperature components.

10. A heat exchanger for cooling high temperature components of a circuit board, comprising:
   a housing including a coolant inlet, a coolant outlet, a first side wall, a second side wall, and an upper housing portion separable with a lower housing portion;
   a first array of plates on the upper housing portion; and
   a second array of plates on the lower housing portion extending parallel to and interleaved with the first array of plates, each of the plates of the first and second arrays having an aperture that is laterally and vertically opposed to the aperture of an immediately adjacent plate, the first array of plates and the second array of plates being separate and not interconnected with each other.

11. The heat exchanger of claim 10, wherein the interleaving first and second arrays of plates create a lateral and vertical serpentine fluid flow path.

12. The heat exchanger of claim 11, wherein the lateral and vertical serpentine fluid flow path creates turbulent flow in a coolant flowing through the heat exchanger.

13. The heat exchanger of claim 12, wherein the interleaving first and second arrays of plates are localized near the high temperature components of the circuit board.

14. The heat exchanger of claim 12, wherein a number of the plates of the first and second arrays is adjusted to lower a resistance of the coolant flowing through the heat exchanger.

15. The heat exchanger of claim 12, wherein the apertures of the first array of plates are indentations at a bottom corner of each plate nearest the first side wall of the housing, and wherein the apertures of the second array of plates are indentations at an upper corner of each plate nearest the second side wall of the housing.

16. The heat exchanger of claim 15, wherein the indentations of the first array of plates are rectangular cutouts at the bottom corner of each plate, and wherein the indentations of the second array of plates are rectangular cutouts at the upper corner of each plate.

17. The heat exchanger of claim 15, wherein the housing and the first and second arrays of plates are formed from aluminum.

18. The heat exchanger of claim 15, wherein the heat exchanger is configured to cool a circuit board used in an electric turbocharger system.

* * * * *